US009989837B2

(12) United States Patent
Yang et al.

(10) Patent No.: US 9,989,837 B2
(45) Date of Patent: Jun. 5, 2018

(54) LIGHTING DEVICE AND PROJECTION DEVICE

(75) Inventors: Yi Yang, Shenzhen (CN); Fei Fu, Shenzhen (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 734 days.

(21) Appl. No.: 14/235,752

(22) PCT Filed: Aug. 29, 2012

(86) PCT No.: PCT/CN2012/080675
§ 371 (c)(1),
(2), (4) Date: Mar. 25, 2014

(87) PCT Pub. No.: WO2013/017111
PCT Pub. Date: Feb. 7, 2013

(65) Prior Publication Data
US 2014/0375959 A1    Dec. 25, 2014

(30) Foreign Application Priority Data

Aug. 4, 2011  (CN) .......................... 2011 1 0222464
Mar. 19, 2012 (CN) .......................... 2011 1 0397907

(51) Int. Cl.
*G03B 21/20*  (2006.01)
*G03B 33/08*  (2006.01)
(Continued)

(52) U.S. Cl.
CPC ............ *G03B 21/204* (2013.01); *F21V 13/08* (2013.01); *F21V 14/08* (2013.01);
(Continued)

(58) Field of Classification Search
CPC .. G03B 21/204; G03B 33/08; G03B 21/2066; F21V 14/00; F21V 8/08; H04N 9/3114
(Continued)

(56) References Cited

U.S. PATENT DOCUMENTS 8,118,443 B2    2/2012  Huang et al.
8,662,678 B2 *  3/2014  Hirata .................... G03B 21/20
                                                    353/94
(Continued)

FOREIGN PATENT DOCUMENTS

CN   101451685   6/2009
CN   101581410   11/2009
(Continued)

OTHER PUBLICATIONS

International Search Report in the parent PCT application No. PCT/CN2012/080675, dated Dec. 6, 2012.
(Continued)

*Primary Examiner* — Steven H Whitesell Gordon
*Assistant Examiner* — Jerry Brooks
(74) *Attorney, Agent, or Firm* — Chen Yoshimura LLP (57) ABSTRACT

A lighting device (100) and a projection device, comprising a light source for generating a blue excitation light (110), a base board (130), and a wavelength conversion material layer (140) covered on the base board (130). The wavelength conversion material layer (140) absorbs a part of the blue excitation light and emits an excited light. The color coordinate of the excited light is within the pre-configured color area, so that a mixed light combined by the excited light and the remaining blue excitation light not absorbed by the wavelength conversion material layer (140) exits the wavelength conversion material layer (140). The color coordinate of the mixed light is closer to the pre-set blue light color coordinate than the color coordinate of the blue excitation light.

18 Claims, 10 Drawing Sheets

(51) Int. Cl.
*H04N 9/31* (2006.01)
*F21V 13/08* (2006.01)
*F21V 14/08* (2006.01)
*H01S 5/00* (2006.01)

(52) U.S. Cl.
CPC ......... *G03B 21/2066* (2013.01); *G03B 33/08* (2013.01); *H04N 9/3114* (2013.01); *H01S 5/005* (2013.01)

(58) Field of Classification Search
USPC .............................................. 353/31; 362/84
See application file for complete search history.

(56) References Cited

U.S. PATENT DOCUMENTS

| | | | | |
|---|---|---|---|---|
| 9,167,659 | B2* | 10/2015 | Coe-Sullivan | ....... H05B 33/145 |
| 2007/0081336 | A1* | 4/2007 | Bierhuizen | ............ H04N 9/315 |
| | | | | 362/293 |
| 2008/0128735 | A1 | 6/2008 | Yoo et al. | |
| 2009/0034284 | A1* | 2/2009 | Li | .......................... G03B 33/06 |
| | | | | 362/554 |
| 2009/0284148 | A1 | 11/2009 | Iwanaga | |
| 2010/0296269 | A1 | 11/2010 | Huang et al. | |
| 2012/0038280 | A1 | 2/2012 | Zoorob et al. | |

FOREIGN PATENT DOCUMENTS

| | | |
|---|---|---|
| CN | 102142510 | 8/2011 |
| GB | 2469794 | 11/2010 |
| JP | 2005251649 | 9/2005 |

OTHER PUBLICATIONS

IPRP in the parent PCT application No. PCT/CN2012/080675, dated Feb. 4, 2014.
Extended European Search Report, dated Jun. 2, 2016, in a counterpart EP application, No. EP 12820118.3.

* cited by examiner

Fig. 13 ial in the lighting device of the present invention; and
LIGHTING DEVICE AND PROJECTION DEVICE

FIELD OF THE INVENTION

This invention relates to projection technology, and in particular, it relates to a lighting device and a projection system which employs this lighting device, and a method of blue light correction.

DESCRIPTION OF THE RELATED ART

Solid state light source, such as blue laser diode (LD, laser diode) or light emitting diode (LED, light emitting diode), can generate high brightness light rays and is widely used in various electrical products such as lighting device.

Currently different kinds of solid state light source can emit different color lights, such as blue light, red light or yellow light. However, generally the wavelength of the blue light emitted by blue excitation light itself is in the range of 440 nm to 450 nm, its color coordinate is about (0.15, 0.016). In the international digital television standard Rec709, the color coordinate of the pure blue light is (0.152, 0.061), the dominant wavelength of which is 462 nm. Therefore, the blue light emitted by a general blue excitation light (in the wavelength range of 440 nm to 450 nm) appears like a blue-violet light but not a pure blue light, so the visual effect of the solid state light source will be affected.

So, it is desired to provide a lighting device and a projection system which employs this lighting device, and a method of blue light correction to solve the problems in the prior art.

SUMMARY OF THE INVENTION

The main technical problems solved by the present invention is to provide a lighting device and a projection system which employs this lighting device, and a method of blue light correction, to generate a blue light which is closer or substantially equal to a pre-defined color light.

The present invention provides a lighting device, comprising:

a light source for generating a blue excitation light;

a base board which comprises at least one segment located in the light path of the blue excitation light, wherein at least one of the at least one segment is a blue segment; and a wavelength conversion material layer covering the blue segment, wherein the wavelength conversion material layer absorbs a part of the blue excitation light and emits a converted light whose color coordinates is within a pre-defined color area, so that a mixed light emitted from the blue segment is formed by the converted light and a remaining blue excitation light which is not absorbed by the wavelength conversion material layer, wherein the color coordinate of the mixed light is closer to a pre-defined blue light color coordinate than the color coordinate of the blue excitation light.

The present invention also provides a projection device which comprises the lighting device mentioned above.

Compared with conventional blue solid state light source which cannot emit pure blue light that meets color requirements, the lighting device and projection device in the present invention can adjust the wavelength range or color coordinate of the blue light by using a converted light, so that the emitted blue light is closer or substantially equal to a pre-defined blue light color coordinate, and the visual effect of the lighting device and the whole color performance are guaranteed.

DETAILED DESCRIPTION OF THE PREFERRED EMBODIMENTS

Embodiments of the present invention are explained below with reference to the drawings. All directional words mentioned in the description, such as up, down, front, back, left, right, inside, outside, lateral etc. only illustrate the reference directions in the Figures. Therefore, the directional words are used to explain and understand the present invention, but not a limitation to the present invention.

In the Figures, same labels are used to mark the units with similar structures.

Figure 3:
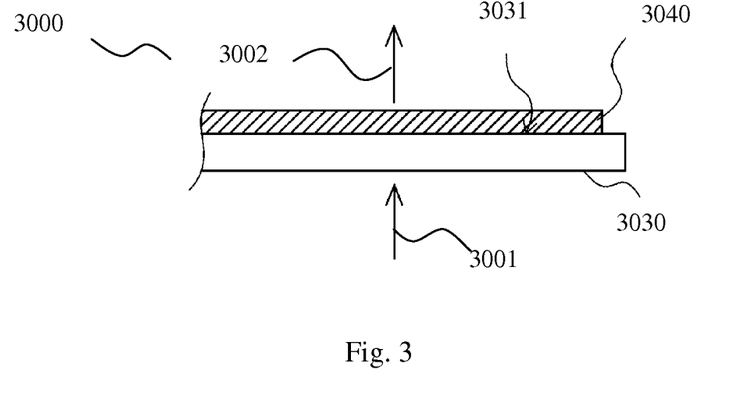
FIG. 3 is a schematic view of a lighting device in the first embodiment of the present invention.

Refer to FIG. 3, which is a schematic view of the first embodiment of the lighting device 3000 in the present invention. In the present embodiment the lighting device includes a light source (not shown in the Figure) for generating a blue excitation light 3001 whose peak wavelength of the spectrum is larger than or equal to 430 nm and smaller than or equal to 465 nm. The lighting device also includes a base board 3030 which includes at least one segment located in the light path of the blue excitation light 3001, and at least one of the at least one segment is a blue segment 3031.

The lighting device also includes a wavelength conversion material layer 3040 covering the blue segment 3031, wherein the wavelength conversion material layer absorbs a part of the blue excitation light 3001 and emits a converted light, so that a mixed light 3002 emitted from the blue segment 3031 is formed by the converted light and the remaining blue excitation light which is not absorbed by the wavelength conversion material layer 3040, wherein the color coordinate of the mixed light is closer to a pre-defined blue light color coordinate than the color coordinate of the blue excitation light 3001.

The wavelength conversion material layer 3040 includes wavelength conversion material which may be phosphor or quantum dots. For example, the wavelength conversion material may be green phosphor or cyan phosphor or yellowish green phosphor or yellow phosphor or a mixture of multiple kinds of these phosphors, which can absorb a part (such as 10%) of the blue excitation light 3001 falling on the blue segment and then emit a green or cyan converted light (the wavelength range is, for example, 500-600 nm), so that the converted light and the remaining blue excitation light mix to form the mixed light. Because the mixed light includes a part of green or cyan converted light, the color coordinate of the mixed light shifts to the green color direction so that the mixed light emitted from the blue segment 3031 has better blue visual appearance. However, the converted light of the wavelength conversion material layer 3040 is not limited to green or cyan light; it can be other color lights whose wavelength is larger than that of the blue excitation light to correct the blue excitation light. The absorption rate value and the wavelength range of the converted light mentioned above are examples for purpose of illustration, but not limitations of the present invention.

Specifically, in the CIE color space, the color coordinate of the mixed light formed by the blue excitation light and the converted light is located on the line linking the color coordinates of the blue excitation light and the converted light. The color mixing principle is shown as following:

Let the brightness of the blue excitation light and the converted light be L1 and L2 respectively, and their color coordinates be respectively (x1, y1) and (x2, y2) respectively, then the brightness L and color coordinate (x, y) of the mixed light are expressed as:

$$L = L_1 + L_2 \quad (1)$$

$$x = \left(L_1 \frac{x_1}{y_1} + L_2 \frac{x_2}{y_2}\right) \bigg/ \left(\frac{L_1}{y_1} + \frac{L_2}{y_2}\right) \quad (2)$$

$$y = (L_1 + L_2) \bigg/ \left(\frac{L_1}{y_1} + \frac{L_2}{y_2}\right) \quad (3)$$

Therefore, by choosing the wavelength conversion material, the color coordinate of the converted light emitted by the wavelength conversion material can be selected to be located on or near the extension line which connects the color coordinate of the blue excitation light 3001 and the pre-defined blue color coordinate. Then, on the line which connects the color coordinates of the blue excitation light and the converted light, a point near the pre-defined blue color coordinate is selected to be the color coordinate of the mixed light. Then, based on the known color coordinate values of the blue excitation light, the converted light and the mixed light, the brightness ratio of the blue excitation light to the converted light can be calculated using the equations mentioned above. Thus, by adjusting the brightness ratio of the blue excitation light to the converted light, the color coordinate of the mixed light is closer to the pre-defined blue color coordinate than the color coordinate of the blue excitation light.

The brightness ratio of the blue excitation light to the converted light can be adjusted by changing the amount of the wavelength conversion material which is added into the wavelength conversion material layer 3040. Obviously, when the amount of the wavelength conversion material becomes larger, the absorbed optical power of the blue excitation light 3001 becomes larger, and the converted light generated by excitation becomes larger, so the brightness ratio of the remaining blue excitation light to the converted light becomes lower, and vice versa.

From equations (1) to (3), it can be seen that by selecting suitable wavelength conversion material in the wavelength conversion material layer 3040 and adjusting the brightness ratio of the blue excitation light to the converted light by changing the amount of the wavelength conversion material, a better blue light can be obtained.

Figure 12A:
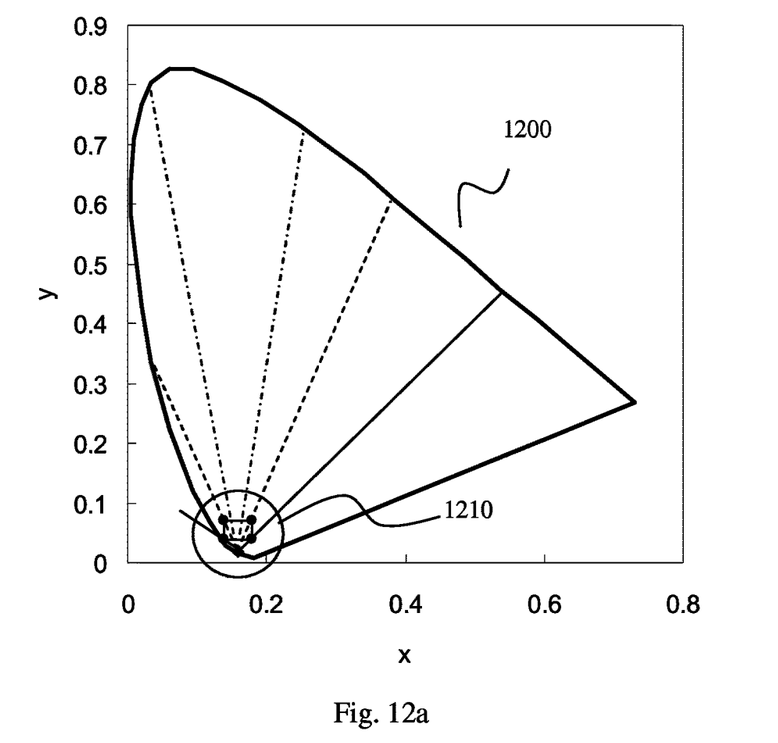
FIGS. 12a and 12b illustrate the color coordinate range of a converted light emitted by a wavelength conversion material in the lighting device of the present invention.
Figure 12B:
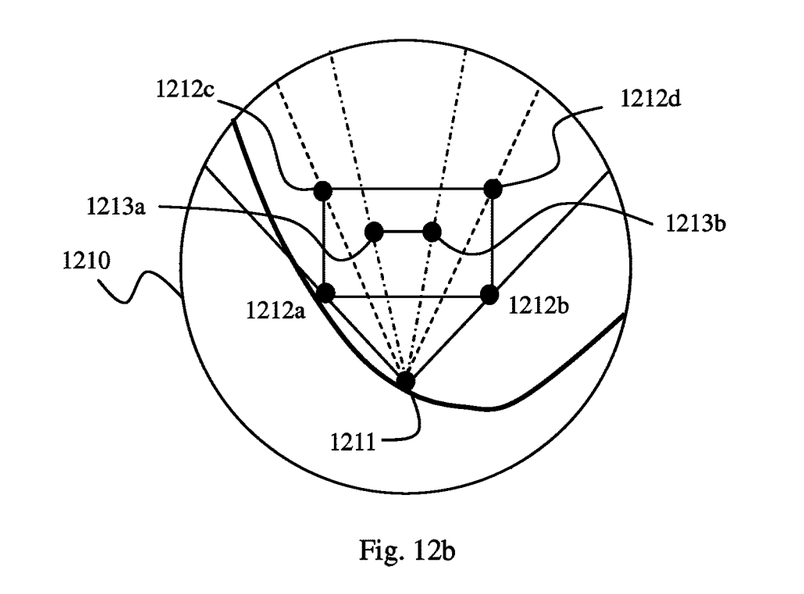

The selection principle of the wavelength conversion material is explained in detail below. In the CIE1931 color space 1200 shown in FIG. 12a, the enlarged view of the blue area 1201 is shown in FIG. 12b. In FIG. 12b, 1211 is the color coordinate of the blue excitation light 3001, for example but not limited to (0.16, 0.016), and the rectangle area whose four vertexes are respectively 1212a, 1212b, 1212c and 1212d is the color coordinate area with good blue color, wherein the color coordinate of 1212a is (0.14, 0.03), the color coordinate of 1212b is (0.18, 0.03), the color coordinate of 1212c is (0.14, 0.08), the color coordinate of 1212d is (0.18, 0.08). In this blue color coordinate area, preferred blue color coordinates are located on the line segment whose two endpoints are 1213a and 1213b, wherein the color coordinate of 1213a is (0.155, 0.06), the color coordinate of the 1213b is (0.165, 0.06). From the analysis described above it can be understood that to get the color coordinate inside the rectangle area whose four vertexes are 1212a, 1212b, 1212c and 1212d by mixing a converted light and the blue light shown as 1211, the color coordinate of the converted light needs to be within a first color area. The first color area is defined by the following line segments, lines or curved lines which intersect end to end: the line and its extension line (straight line) formed by connecting the color coordinate 1211 and the color coordinate 1212a, the line segment between the color coordinate 1212a and 1212b (line segment), the line and its extension line formed by connecting the color coordinate 1211 and the color coordinate 1212b (straight line), and the boundary curved line of the color space 1200 (curved line). The boundary curved line of color space 1200 is based on the CIE published data, which is well known in this technical field. From the knowledge of chromatology it is easy to calculate that the dominant wavelength range corresponding to the color coordinates in the first color area is about from 465 nm to 585 nm.

Furthermore, to get a better blue color coordinate, the color coordinate of the converted light needs to be within a second color area. The second color area is formed by the following line segments, lines or curved lines which intersect end to end: the line and its extension line formed by linking the color coordinate 1211 and the color coordinate 1212c (straight line), the line segment between the color coordinate 1212c and 1212d (line segment), the line and its extension line formed by linking the color coordinate 1211 and the color coordinate 1212d (straight line), and the boundary curved line of the color space 1200 (curved line). From the knowledge of chromatology it is easy to calculate that the dominant wavelength range corresponding to the color coordinate in the second color area is about from 492 nm to 562 nm.

Obviously, the second color area is a subset of the first color area. When the color coordinate of the converted light is inside the second color area, if the ratio of the blue excitation light to the converted light is adjusted appropriately, the mixed light finally obtained by the lighting device 3000 is closer to the ideal blue light.

Furthermore, to get a more preferred blue light range, namely the blue light color coordinates located on the line segment whose endpoints are 1213a and 1213b, the color coordinate of the converted light is needed to be within a third color area. The third color area is formed by the following line segments, lines or curved lines which intersect end to end: the line and its extension line formed by linking the color coordinate 1211 and the color coordinate 1213a (straight line), the line segment between the color coordinate 1213a and 1213b (line segment), the line and its extension line formed by linking the color coordinate 1211 and the color coordinate 1213b (straight line), and the boundary curved line of the color space 1200 (curved line). From the knowledge of chromatology it is easy to calculate that the dominant wavelength range corresponding to the color coordinate in the third color area is about from 515 nm to 545 nm.

Obviously, the third color area is a subset of the second color area. When the color coordinate of the converted light is inside the third color area, if the ratio of the blue excitation light to the converted light is adjusted appropriately, the mixed light finally obtained by the lighting device 3000 is located on the line segment whose endpoints are 1213a and 1213b.

Based on experiment data, when the amount of the wavelength conversion material layer 3040 is adjusted so that the ratio of the optical power of the blue excitation light 3001 absorbed by the wavelength conversion material layer 3040 to the total optical power of the blue excitation light 3001 is in the range of 1% to 50%, the output mixed light color is improved compared with the color coordinate of the blue excitation light 3001. Preferably, the ratio of the optical power of the blue excitation light 3001 absorbed by the wavelength conversion material layer 3040 to the total optical power of the blue excitation light 3001 is in the range of 10% to 30%.

In the present embodiment, preferably, the base board 3030 also acts as a second light filter which is located on the side of the wavelength conversion material layer 3040 where the blue excitation light 3001 illuminates. The second light filter is coated with interference coating on the surface which can transmit the blue excitation light 3001 and reflect the converted light. The blue excitation light 3001 transmits through the second light filter 3030 and is incident onto the wavelength conversion material layer 3040; a part of it is absorbed by the wavelength conversion material and converted to converted light which is emit. Because the converted light emission is isotropic, the converted light has two parts, the first part being directly emitted into its upper space, the second part being incident onto the second light filter 3030 and reflected by it and finally emitted into the upper space. The second part of the converted light is mixed with the first part of the converted light and the unabsorbed remaining blue excitation light to form the output light 3002 of the lighting device 3000. The second light filter is used to reflect the converted light falling on it to guide the light to the output direction (upper direction in FIG. 3), to increase the intensity of the converted light in the output light 3002 of the lighting device 3000.

Further preferably, the surface of the base board 3030 that has the interference coating is near the wavelength conversion material layer 3040, and there is an air gap between this surface and the wavelength conversion material layer 3040. The advantage of having the base board coating surface face the wavelength conversion material layer 3040 is that the converted light cannot travel and spread transversely inside the base board 3030, so that the light spot expansion and the power density reduction are prevented. The air gap between the interference coating and the wavelength conversion material layer 3040 enables the design of the interference coating to be simplified.

Figure 1:
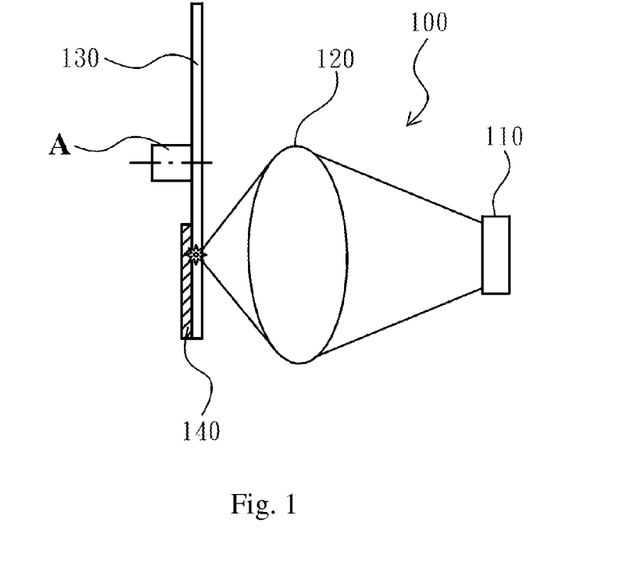
FIG. 1 is a schematic view of a lighting device in the second embodiment of the present invention.

Refer to FIG. 1, which is a schematic view of the lighting device in the second embodiment of the present invention. The lighting device 100 in the present embodiment can be used to generate high brightness multi-color light. The lighting device 100 includes a light source 110, a focusing optical component 120, a base board 130 and a wavelength conversion material layer 140. The light source 110 is used to generate a blue excitation light, and the focusing optical component 120 is used to focus the blue excitation light onto the base board 130.

Light source 110 can be one solid state light source or a combination of multiple solid state light sources. This solid state light source, such as blue LD, LED or a combination of these two, is used to generate blue excitation light, which has a peak wavelength larger than or equal to 430 nm and smaller than or equal to 465 nm. Taking blue excitation light whose peak wavelength is 445 nm for example, its color coordinate is about (0.16, 0.016).

Figure 2:
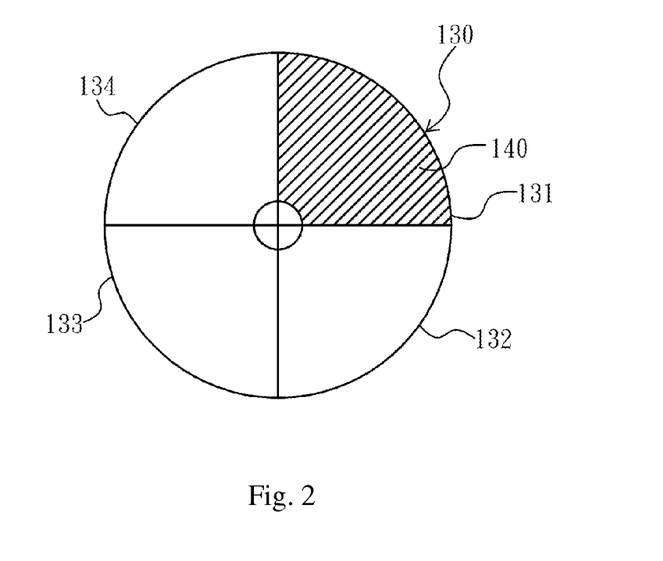
FIG. 2 is the front view of a base board in the embodiment shown in FIG. 1.

Another difference between the present embodiment compared with the first embodiment is that, the lighting device also includes a driving device, wherein the wavelength conversion material layer 140 and the base board 130 are fixedly connected to the driving device respectively, and the driving device drives the base board 130 and the wavelength conversion material layer 140 to move relatively to the blue excitation light, so that each segment 131, 132, 133, 134 of the base board 130 are disposed in the light path of the blue excitation light in turn, as shown in FIG. 1 and FIG. 2. The base board 130 in the present embodiment is made of optical transparent material, such as glass, PMMA plastic etc. The base board 130 includes multiple segments 131, 132, 133 and 134, wherein the segment 131 is blue segment 131. The wavelength conversion material layer 140 is disposed on the blue segment 131 of the base board 130, and covers at least a part of the area of the blue segment 131 to absorb the blue excitation light and emit a converted light, so that a mixed light emitted from the blue segment 131 is formed by the converted light and the remaining blue excitation light unabsorbed by the wavelength conversion material layer, wherein the color coordinate of the mixed light is closer to a pre-defined blue light color coordinate than the color coordinate of the blue excitation light. The range of the color coordinate of the converted light is the same to that of the first embodiment.

In the present embodiment, at least one segment among the segments 132 to 134 includes a wavelength conversion material (not shown in Figures) different from the wavelength conversion material layer 140, to absorb the blue excitation light and emit another converted light whose wavelength is different from that of the blue excitation light. As a result, other color light different from blue light can be generated this wavelength conversion material. The wavelength conversion materials are preferably fluorescent materials such as phosphors, nano-structured materials (such as quantum dots) etc. The wavelength conversion materials can be deposited on the surface of the base board 130, or can be added into the material of the base board 130.

In the present embodiment, the base board may be, for example, a round shaped wheel, which rotates around an axis A. The segments 131 to 134 of the base board 130 can be arranged around the axis A in turn. The segments 131-134 can be blue segment 131, green segment 132, red segment 133 and white segment 134 respectively. The wavelength conversion material on the green segment 132, the red segment 133 and the white segment 134 are selected respectively to emit lights with wavelength ranges 500-580 nm, 580-700 nm and 480-700 nm, so that the blue excitation light of the light source 110 can be converted to green light, red light and white light respectively on the green segment 132, red segment 133 and white segment 134. When the base board 130 rotates around the axis A, the base board 130 rotates relatively to the light source 110, and different segments 131-134 are exposed in different time under the blue excitation light, so that multi-color light can be emitted in turn by the rotating base board 130.

In other embodiments, the base board can include less (such as two or three) or more (such as eight) segments. The base board 130 can also have only one blue segment, and in this case the base board does not need to move relative to the light source, as long as the blue segment is disposed in the light path of the blue excitation light. When there are two or more segments on the base board, it is also possible that the base board does not move relatively to the light source 120, while multiple light sources are used correspondingly to the segments of the base board. For example, a blue light source can be provided for the blue segment of the base board to generate blue light, and a ultra-violet light source can be provided for the red segment of the base board to generate red light.

In another embodiment, the base board 130 includes at least one green segment carrying a green phosphor which absorbs the blue excitation light and emits a green light; at least one yellow segment carrying a yellow phosphor which absorbs the blue excitation light and emits a yellow light; or at least one red segment carrying a red phosphor which absorbs the blue excitation light and emits a red light.

Figure 4:
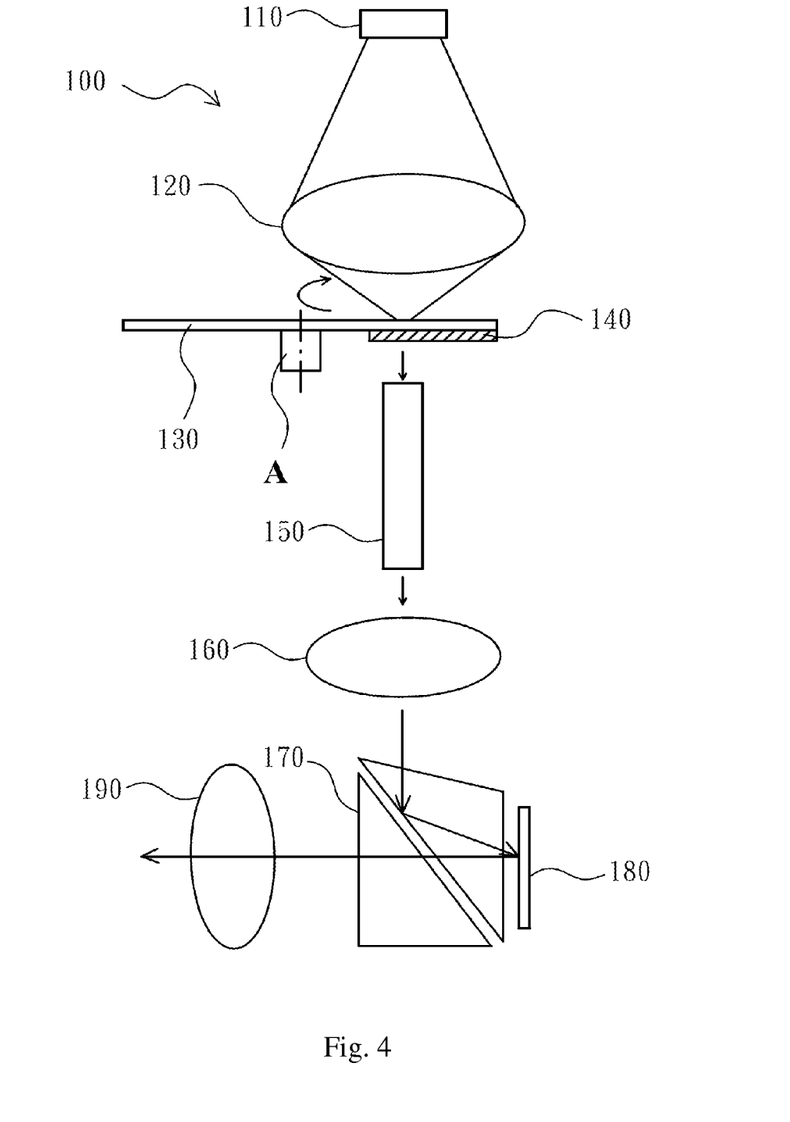
FIG. 4 is a schematic view of a projection device of the present invention.

Refer to FIG. 4, which is a schematic view of a projection device of the present invention. The lighting device 100 in the present embodiment can be employed in a projection system, which includes a light source 110, a focusing optical component 120, a base board 130, a wavelength conversion material layer 140, an optical integrator 150, an optical relay or collection device 160, a prism 170, a micro-display imager 180 and a projection lens 190. The blue excitation light emitted by the light source 110 can generate a multi-color light through the base board 130. The multi-color light can be made uniform in intensity through the optical integrator 170 (by light mixing). The optical relay 160 can focus the mixed light onto the micro-display imager 180 through the prism 170. The light modulated by the micro-display imager 180 can be projected onto a display screen by the projection lens 190. A color image can be obtained by the synchronization between the micro-display imager 180 and the base board 130 which can be controlled by a signal processor (not shown in the Figure).

In the above embodiments, the color coordinate of the converted light emitted by the wavelength conversion material layer is required to be located at particular position in CIE 1931 color space. However, in practice, available wavelength conversion materials that can be selected are limited, so some wavelength conversion materials may emit converted light whose color coordinate cannot meet the above requirements. In the present invention, a light filter can be used to filter the converted lights in order to meet the color requirement mentioned above.

Figure 5:
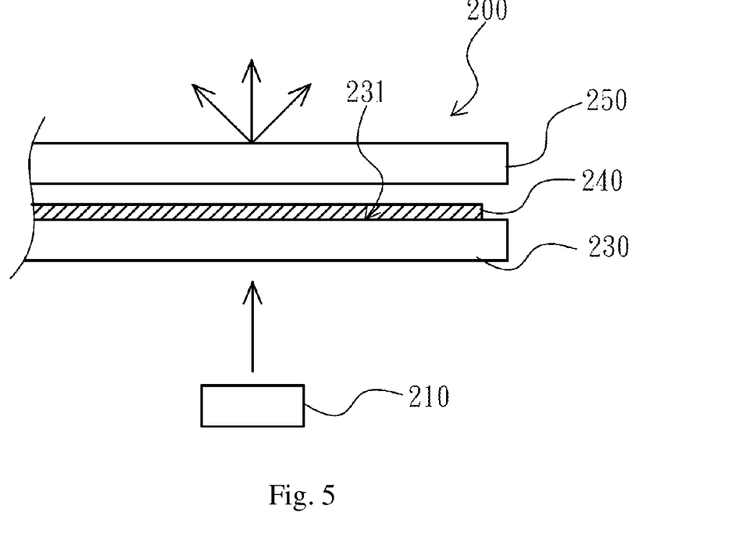
FIG. 5 is a schematic view of a lighting device in the third embodiment of the present invention.

Take reference Refer to FIG. 5, which is a schematic view of the lighting device in the third embodiment of the present invention. The light device 200 in the third embodiment includes a light source 210, a base board 230, and a wavelength conversion material layer 240. Different from the first embodiment, the present embodiment also includes a first light filter plate (or a first filter layer) 250.

The first light filter 250 is disposed on the wavelength conversion material layer 240, namely the wavelength conversion material layer 240 is located between the first light filter 250 and the blue segment 231 of the base board. The first light filter only transmits the converted light whose wavelength is smaller than or equal to a pre-defined wavelength value. There is optionally a pre-defined distance (an air gap) between the first light filter 250 and the wavelength conversion material layer 240; or, the first light filter 250 may also be disposed in contact with the wavelength conversion material layer 240.

Figure 6:
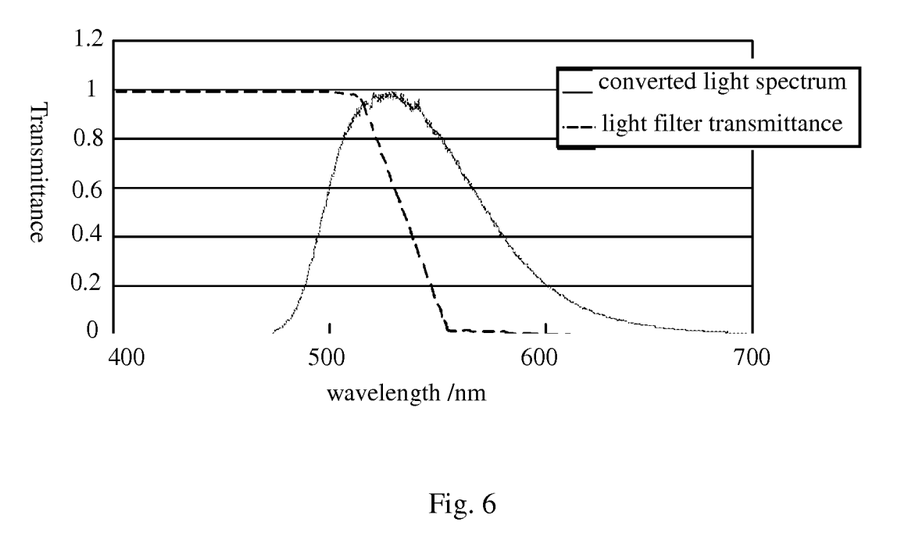
FIG. 6 illustrates a relationship between a transmittance of a first light filter and a spectrum of a converted light in the embodiment shown in FIG. 5 in the present invention.

Refer to FIG. 6, which illustrates the relationship between the transmittance of the first light filter and the spectrum of the converted light in the embodiment shown in FIG. 5. As shown in FIG. 6, in the present embodiment, the first light filter 250 can only transmit the mixed light whose wavelength range is lower than or equal to 550 nm. As shown in FIG. 5, by using the wavelength conversion material layer 240 and the first light filter plate (the first filter layer) 250 of the present embodiment, the x value of the color coordinate of the mixed light emitted from the blue segment 231 can be smaller than 0.3, preferably the x value is larger than or equal to 0.1 and smaller than or equal to 0.2, such as 0.15. In the present embodiment the color coordinate of the mixed light emitted from the blue segment 231 can be (0.16, 0.052). Thus, using the light filter 250, the mixed light emitted from the blue segment 231 can be further made closer to the pure blue light in the international standard.

Therefore, the effect of the first light filter is that, the converted light is filtered by the first light filter which is located in the output light path of the mixed light, so that the color of the mixed light is closer or reaches the pre-defined blue color coordinate.

As shown in FIG. 5, in the present embodiment, the wavelength conversion material layer 240 is disposed on one side surface of the base board 230, and the first light filter 250 is disposed on the wavelength conversion material layer 240. In another embodiment, the first light filter 250 can also be located after the collection optical system, or at other places of the light path in the system; there is no limitation to this in the present invention.

It should be pointed out that, because the blue excitation light is often a coherent light, in practice a coherence eliminating device is needed to eliminate the original light coherence. The most commonly used method to eliminate light coherence is scattering. For example, scattering material can be added into the wavelength conversion material layer of the present invention, so that the wavelength conversion material layer can not only absorb a part of the blue excitation light and emit a converted light, but also scatter the unabsorbed remaining blue excitation light to eliminate its coherence to significantly reduce the amount of coherent light in the output light emitted from the lighting device of the present invention. In all the embodiments of the present invention scattering material can be added into the wavelength conversion material layer.

Besides the scattering material added into the wavelength conversion material layer, a roughening process can be used to treat the surfaces of the base board, the first light filter or the second light filter to scatter the blue excitation light.

Figure 8A:
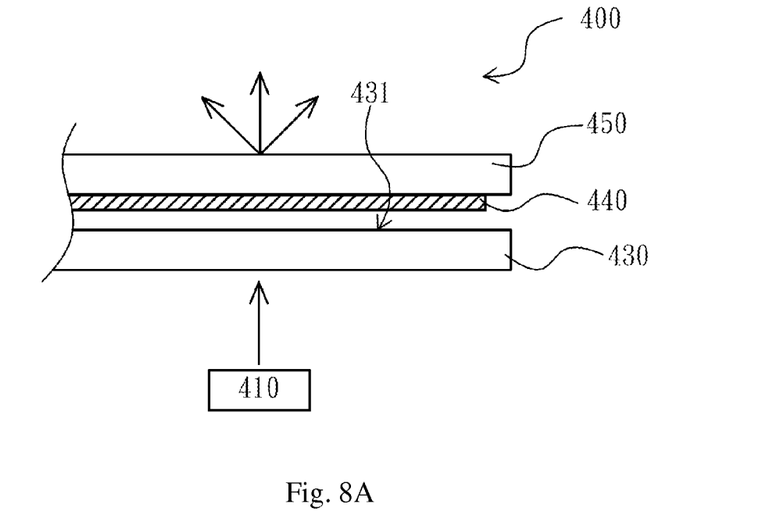
FIG. 8A is a schematic view of a lighting device in the fourth embodiment of the present invention.
Figure 8B:
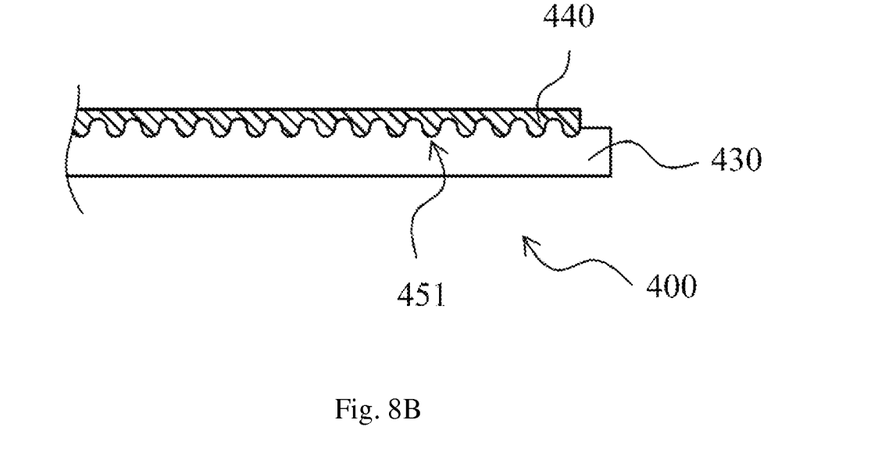
FIG. 8B is a partial enlarged view of FIG. 8A.

Refer to FIG. 8A and FIG. 8B, where FIG. 8A is a schematic view of the lighting device in the fourth embodiment of the present invention, and FIG. 8B is a partially enlarged view of FIG. 8A. The lighting device 400 in the fourth embodiment includes a light source 410, a base board 430, a wavelength conversion material layer 440 and a first light filter 450. The wavelength conversion material layer 440 is disposed on the blue segment 431 of the base board 430, which is used to absorb a part of the blue excitation light in the blue segment 431 and emit a converted light, so that the converted light emitted from the wavelength conversion material layer 440 and the remaining blue excitation light of the blue segment can be mixed to form an appropriate mixed blue light. In the fourth embodiment, the base board 430 is a second light filter which can transmit the blue excitation light and reflect the converted light; the first light filter 450 is disposed on one side surface of the base board 430 (the second light filter), and the wavelength conversion material layer 440 is disposed on the first light filter surface which faces the base board 430. In this case, the blue excitation light emitted from the light source 410 is incident onto the base board 430 from the side which is opposite to the wavelength conversion material layer 440. The converted light emitted from the wavelength conversion material layer 440 can be modified by the first light filter 450. There is optionally a pre-defined distance (an air gap) between the base board 430 and wavelength conversion material layer 440; or, the base board 430 may also be disposed in contact with the wavelength conversion material layer 440.

And, as shown in FIG. 8A and FIG. 8B, the first light filter 450 can have micro-structure 451 on its surface which faces the base board 430, and the phosphor material of the wavelength conversion material layer 440 can be filled in the cavities of the micro-structure 451. Therefore, by controlling the depth and shape of the micro-structure 451, the coating amount of the wavelength conversion material layer 440 can be controlled, so that the color of the output light can be accurately controlled. In a macroscopic point of view, the micro-structure can also play the same role of the roughening process of the surface, i.e., when the blue excitation light is incident onto the surface of the micro-structure, a certain degree scattering will occur to eliminate coherence of the laser.

Because it is difficult to coat a thin film on the micro-structure 451, preferably, the thin film of the first light filter 450 is coated on the surface which is on the side facing away from the wavelength conversion material 440.

Figure 9A:
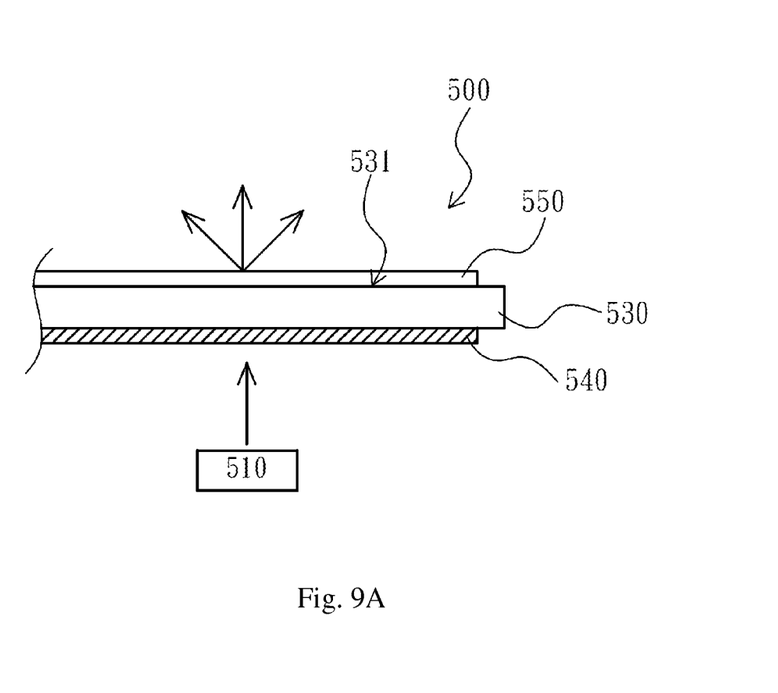
FIG. 9A is a schematic view of a lighting device in the fifth embodiment of the present invention.
Figure 9B:
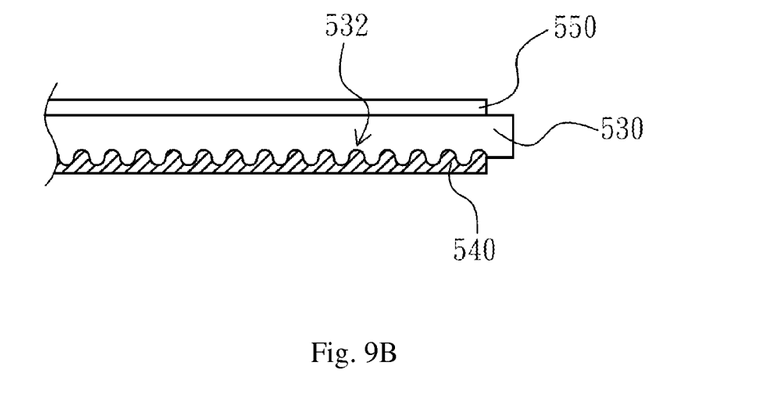
FIG. 9B is a partial enlarged view of FIG. 9A.

Refer to 9A and 9B, where FIG. 9A is a schematic view of the lighting device in the fifth embodiment of the present invention, and FIG. 9B is a partially enlarged view of FIG. 9A. The lighting device 500 of the fifth embodiment includes a light source 510, a base board 530, a wavelength conversion material layer 540 and a first light filter plate (or a first filter layer) 550. The wavelength conversion material layer 540 is disposed on the blue segment 531 of the base board 530, which is used to absorb a part of the blue excitation light and emit a converted light, so that the converted light emitted from the wavelength conversion material layer 540 and the remaining blue excitation light of the blue segment can be mixed to form an appropriate mixed blue light. In the fifth embodiment, the first light filter 550 is disposed on a base board surface which is on one side of the base board 530, as shown in FIG. 9B, and the base board 530 can have a micro-structure 532 on its surface which is on the other side; the fluorescent material of the wavelength conversion material layer 540 can be filled in the cavities of the micro-structure 532. Therefore, by controlling the depth and shape of the micro-structure 532, the coating amount of the wavelength conversion material layer 540 can be controlled, so that the color of the output light can be accurately controlled.

Figure 10:
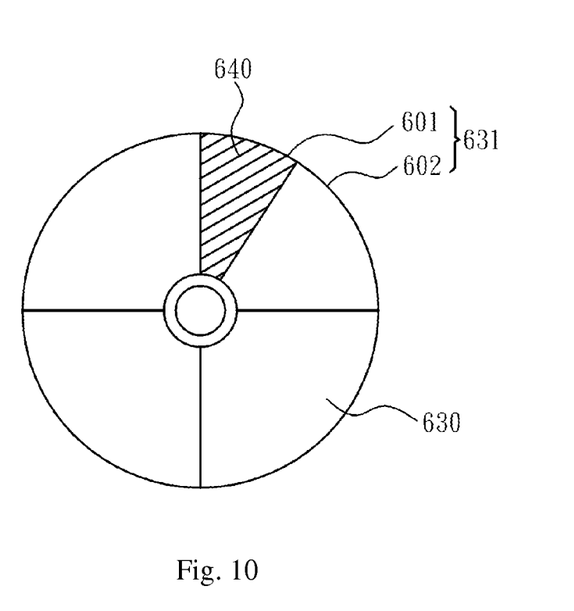
FIG. 10 is a schematic view of a sixth embodiment of the present invention which uses a round shaped base board.

Refer to FIG. 10, which is a schematic view of the sixth embodiment which uses a round shape base board in the present invention. In the sixth embodiment, the wavelength conversion material layer 640 (shown as the shaded area in FIG. 10) is disposed on a part of the area of the blue segment 631 of the base board 630. In this case, the blue segment 631 includes a modification sub-segment 601 and a blank sub-segment 602. The wavelength conversion material layer 640 is disposed on the modification sub-segment 601, and the wavelength conversion material layer 640 can have higher concentration or thicker thickness to increase the absorption of the blue excitation light by the wavelength conversion material layer 640, such as 100% blue excitation light absorption. When the lighting device of the present embodiment is used to form a multi-color light, a blue light and converted light color light sequence is generated by the blue segment 631. In this case, a light modulation chip (not shown in Figures) can be used to mix the color light sequence by synchronized controlling to obtain a blue light which is closer to the pure blue light of the international standard.

Figure 11:
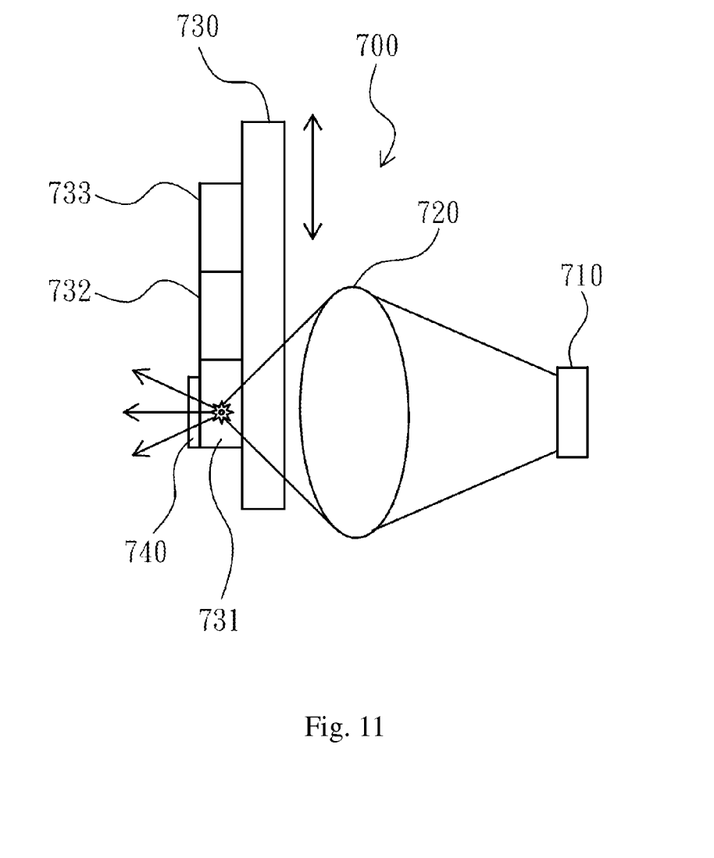
FIG. 11 is a schematic view of a lighting device in the seventh embodiment of the present invention.

Refer to FIG. 11, which is a schematic view of the lighting device in the seventh embodiment of the present invention. The lighting device 700 in the seventh embodiment includes a light source 710, a focusing optical component 720, a base board 730 and a wavelength conversion material layer 740. The light source 710 is used to generate blue excitation light, and the focusing optical component 720 is used to focus the blue excitation light onto a small area of the base board 730. The base board 730 is allowed to move relatively to the light source 720, so that each segment 731, 732 and 733 of the base board 730 is disposed in the light path of the blue excitation light in turn. The wavelength conversion material layer 740 is disposed on the blue segment 731 of the base board 730, which is used to absorb a part of the blue excitation light and emit a converted light, so that the converted light emitted from the wavelength conversion material layer 740 and the remaining blue excitation light of the blue segment can be mixed to form an appropriate mixed blue light. In the seventh embodiment, the base board 730 can be a rectangular moving plate, and different segments 731, 732 and 733 with different colors are linearly arranged on the base board 730. When the rectangle moving plate 730 linearly oscillates these segments 731, 732 and 733 are excited and generate color lights in turn.

Figure 7:
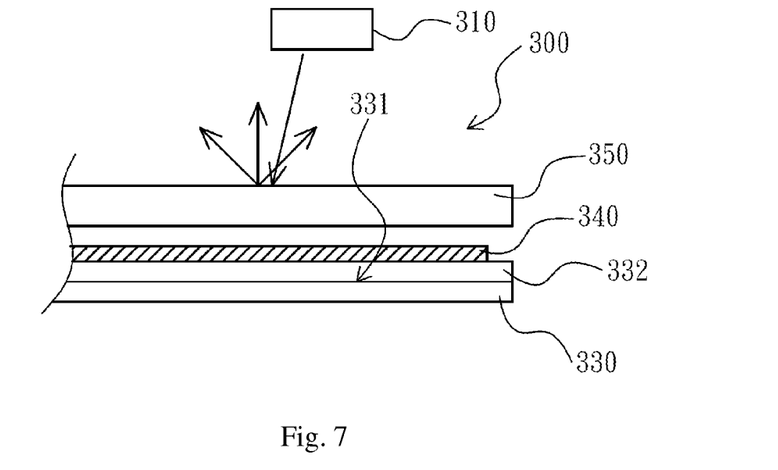
FIG. 7 is a schematic view of a lighting device in the eighth embodiment of the present invention.

In the embodiments mentioned above, a blue excitation light is incident on a wavelength conversion material layer from one side and the mixed light formed by the converted light and the remaining blue excitation light is emitted from the other side. In fact the mixed light can also be emitted from the same side of the blue excitation light. Refer to FIG. 7, which is a schematic view of the lighting device in the eighth embodiment of the present invention.

The lighting device 300 in this embodiment includes a light source 310, a base board 330, a wavelength conversion material layer 340 and a first light filter 350. The differences between this embodiment and the third embodiment are that, the wavelength conversion material layer 340 is disposed on one side surface of the base board 330, and the first light filter 350 is disposed on the wavelength conversion material layer 340. The base board 330 includes a reflecting layer 332, located on the side of the wavelength conversion material layer 340 opposite the blue excitation light, to reflect the blue excitation light and the converted light that are traveling toward the based board 330. The reflecting layer 332 is attached or coated onto a surface of the base board 330. In this case, the blue excitation light emitted from the light source 310 passes through the first light filter 350 and is incident on the wavelength conversion material layer 340 which is excited to emit an isotropic converted light. The isotropic converted light includes two parts, the first part of the converted light directly exits into the upper space, the second part of the converted light is incident onto the reflecting layer 332 and reflected by it, and finally exits into the upper space above the wavelength conversion material layer 340. The converted light is mixed with the remaining blue excitation light not absorbed by the wavelength conversion material layer 340 to form a mixed blue light. The mixed blue light is further modified by the first light filter 350. There is optionally a pre-defined distance (an air gap) between the first light filter 350 and the wavelength conversion material layer 340; or, the first light filter 350 may also be disposed in contact with the wavelength conversion material layer 340.

Figure 13:
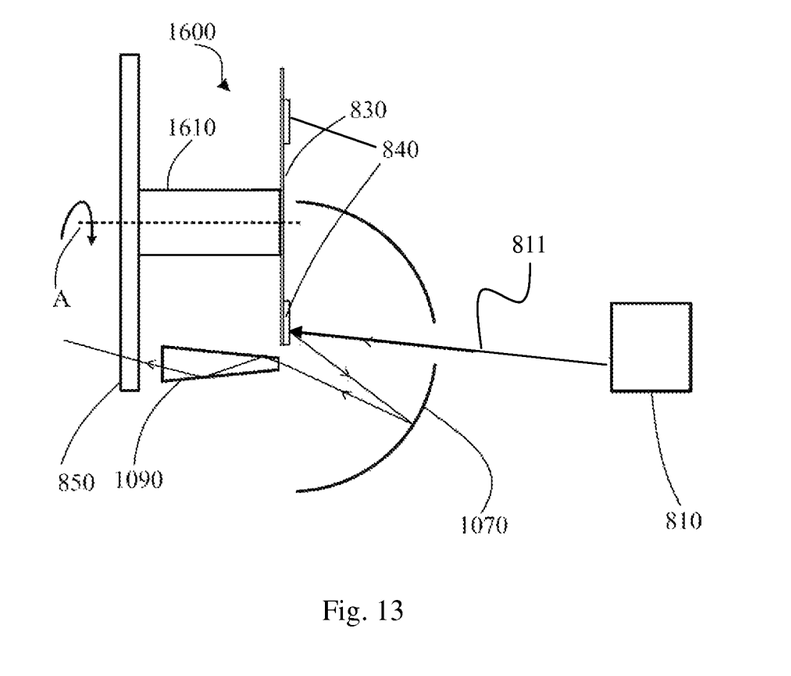
FIG. 13 is a schematic view of a lighting device in the ninth embodiment of the present invention.

In the eighth embodiment mentioned above, the output light of the wavelength conversion material layer 340 faces the light source 310; thus, if the output light is incident on the surface of the light source, a significant light power loss will be occur. So in the ninth embodiment of the present invention, the lighting device also includes a light guiding device located between the wavelength conversion material layer and the light source, as shown in FIG. 13. The light guiding device is used to transmit blue excitation light and reflect the mixed light emitted from the wavelength conversion material layer which is formed by the converted light and unabsorbed remaining blue excitation light so as to separate it from the input light path of the blue excitation light emitted from the light source to form the output light. As a result, the loss of the mixed light caused by the light source is prevented.

In the light device 1600 of the present embodiment, the light guiding device is a curved reflecting device 1070 with a through hole, where the blue excitation light 811 emitted from the light source 810 passes through the through hole of the curved reflecting device and is incident on the surface of the wavelength conversion material layer 840. Similar to the seventh embodiment, the base board 830 includes a reflecting layer on its surface, which is used to reflect the blue excitation light and the converted light to the exterior space. The light emitted from the wavelength conversion material layer 840 is reflected by the curved reflecting surface of the curved reflecting device around the through hole to the entrance of light collection device 1090. By using the light guiding device 1070, the output light is prevented from falling on the light source 810.

Preferably, the curved reflecting device 1070 is a semi-sphere or a part of a semi-sphere; the light spot on the wavelength conversion material layer 840 where the blue excitation light illuminates is located at a first point near the center of the semi-sphere, and the entrance of the light collection device 1090 is located at a second point near the center of the semi-sphere. The first point and the second point are symmetric with respect to the center, so that it can be guaranteed that the light collection efficiency of the light collection device is optimized.

Further preferably, the curved reflecting surface 1070 is a semi-ellipsoid or a part of a semi-ellipsoid; the light spot of the wavelength conversion material layer 840 where the blue excitation light illuminates is located at one focal point of the semi-ellipsoid, and the entrance of the light collection device 1090 is located at the other focal point of the semi-ellipsoid, so that it can be guaranteed that the light collection efficiency of the light collection device is maximized.

Furthermore, the present embodiment also includes a driving device 1610, wherein the wavelength conversion material layer 840 and the base board 830 are fixedly connected to the driving device respectively. The driving device drives the base board 830 and the wavelength conversion material layer 840 to rotate around axis A, so that different areas on the base board are illuminated by the blue excitation light 811 in turn and emit different color lights to form a color sequence. Alternatively, there is only one blue segment on the base board, so as the driving device 1610 rotates, the output light of the light device 1600 remains blue.

Preferably, the lighting device of the present embodiment also includes a first light filter which is fixedly connected to the driving device 1610 and moves synchronously with the wavelength conversion material layer 840. The angle of the first light filter is the same as the angle of the blue segment of the base board 830, and the location of the first light filter corresponds to the location of the blue segment, so that when the blue segment of the base board is illuminated by the blue excitation light, the output light is incident on the first light filter 850 after collected by the light collection device 1090.

Different from the seventh embodiment, the first light filter 850 in the present embodiment is located after the light collection device 1090. The advantage is that the filtering effect is improved because the convergence angle of the light is smaller after the light collecting device 1090.

It is worth noting that all the embodiment of the present invention can employ driving devices so that the wavelength conversion material layer and the blue excitation light move relatively to each other. In this case, the second light filter in the embodiment mentioned above also needs to be fixedly connected to the driving device and move synchronously with the wavelength conversion material layer.

It should be pointed out that there are many variants of the light guiding device shown in the eighth embodiment. Besides the curved reflecting device, the light guiding device also can be a flat reflecting device with a through hole and a reflecting surface around the through hole. Similar to the curved reflecting device in the eighth embodiment, the blue excitation light can pass through the through hole of the flat reflecting device and be incident on the wavelength conversion material layer, and the mixed light formed by the converted light emitted from the wavelength conversion material layer and the remaining blue excitation light is reflected by the reflecting surface of the flat reflecting device around the through hole to form the output light of the lighting device. The flat reflecting device effectively prevents the output light from falling on the light source.

In sum, although the above description has illustrated several preferred embodiments of the present invention, the preferred embodiments are not limitations to the present invention. Those of ordinary skill in the art can make changes and improvements by following the principle of the present invention. The protection scope of the present invention should be determined by the claims.

What is claimed is:
1. A lighting device, comprising:
a light source for generating a blue excitation light;
a base board which comprises at least one segment located in the light path of the blue excitation light, wherein at least one of the at least one segment is a blue segment; and a wavelength conversion material layer covering the blue segment, wherein the wavelength conversion material layer absorbs a part of the blue excitation light and emits a converted light whose color coordinates is within a pre-defined color area, wherein the pre-defined color area is a first color area which is formed by line segments, lines or curved lines which intersect end to end as follows: a line and its extension line formed by connecting color coordinate of the blue excitation light and the color coordinate (0.14, 0.03), a line segment between the color coordinate (0.14, 0.03) and color coordinate (0.18, 0.03), a line and its extension line formed by connecting the color coordinate of the blue excitation light and the color coordinate (0.18, 0.03), and a boundary curved line of the CIE 1931 color space of International Commission on Illumination, so that a mixed light emitted from the blue segment is formed by the converted light and the remaining blue excitation light which is not absorbed by the wavelength conversion material layer, wherein the color coordinate of the mixed light is closer to a pre-defined blue light color coordinate than the color coordinate of the blue excitation light.

2. The lighting device of claim 1, wherein the blue excitation light is a blue laser light, wherein a peak wavelength of a spectrum of the blue laser light is larger than or equal to 430 nanometer (nm) and smaller than or equal to 465 nm.

3. The lighting device of claim 1, wherein the wavelength conversion material layer comprises a green phosphor or a cyan phosphor or a yellowish green phosphor or a yellow phosphor or a mixture of multiple kinds of these phosphors.

4. A projection device, comprising the lighting device of claim 1.

5. The lighting device of claim 1, wherein the wavelength conversion material layer contains a scattering material.

6. The lighting device of claim 1, wherein the pre-defined blue light color coordinate is located inside a rectangle area, and color coordinates of four vertexes of the rectangle area are respectively (0.14, 0.03), (0.18, 0.03), (0.14, 0.08) and (0.18, 0.08).

7. The lighting device of claim 6, wherein the pre-defined blue light color coordinate is located on a line segment, and color coordinates of two endpoints of the line segment are respectively (0.155, 0.06) and (0.165, 0.06).

8. The lighting device of claim 1, wherein the color coordinates of the converted light is within a second color area which is a subset of the first color area and is formed by line segments, lines or curved lines which intersect end to end as follows: a line and its extension line formed by connecting color coordinate of the blue excitation light and color coordinate (0.14, 0.08), a line segment between the color coordinate (0.14, 0.08) and color coordinate (0.18, 0.08), a line and its extension line formed by connecting the color coordinate of the blue excitation light and the color coordinate (0.18, 0.08), and a boundary curved line of the CIE 1931 color space.

9. The lighting device of claim 8, wherein the color coordinates of the converted light is within a third color area which is a subset of the second color area and is formed by line segments, lines or curved lines which intersect end to end as follows: a line and its extension line formed by connecting color coordinate of the blue excitation light and color coordinate (0.155, 0.06), a line segment between the color coordinate (0.155, 0.06) and color coordinate (0.165, 0.06), a line and its extension line formed by connecting the color coordinate of the blue excitation light and the color coordinate (0.165, 0.06), and a boundary curved line of the CIE 1931 color space.

10. The lighting device of claim 1, further comprising a light filter located on one side of the wavelength conversion material layer facing the blue excitation light for transmitting the blue excitation light and reflecting the converted light.

11. The lighting device of claim 10, wherein the light filter is an interference coating on a surface of the base board, which transmits the excitation light and reflects the converted light.

12. The lighting device of claim 1, further comprising a reflecting layer located on one side of the wavelength conversion material layer facing away from the blue excitation light for reflecting the blue excitation light and the converted light.

13. The lighting device of claim 12, wherein the reflecting layer is attached to or coated onto a surface of the base board.

14. The lighting device of claim 12, further comprising a light guiding device for transmitting the blue excitation light and reflecting the mixed light emitted from the wavelength conversion material layer which is formed by the converted light and unabsorbed remaining blue excitation light, wherein the mixed light is separated from an input light path of the blue excitation light of the light source to form the output light.

15. The lighting device of claim 1, further comprising a driving device, wherein the wavelength conversion material layer and the base board are fixedly connected to the driving device respectively, and wherein the driving device drives the base board and the wavelength conversion material layer to move relatively to the blue excitation light.

16. The lighting device of claim 15, further comprising a light filter located in an output light path of the mixed light, which is used to filter the converted light so that color coordinate of the mixed light is closer to or equal to the pre-defined blue color coordinate, wherein the light filter is fixedly connected to the driving device and moves synchronously with the wavelength conversion material layer.

17. The lighting device of claim 15, further comprising a light filter located on one side of the wavelength conversion material layer facing the blue excitation light for transmitting the blue excitation light and reflecting the converted light, wherein the light filter is fixedly connected to the driving device and moves synchronously with the wavelength conversion material layer.

18. The lighting device of claim 15, further comprising a reflecting layer located on one side of the wavelength conversion material layer facing away from the blue excitation light for reflecting the blue excitation light and the converted light, wherein the reflecting layer is fixedly connected to the driving device and moves synchronously with the wavelength conversion material layer.

* * * * *